United States Patent
Xu et al.

(10) Patent No.: US 9,322,890 B2
(45) Date of Patent: Apr. 26, 2016

(54) SYSTEM AND METHOD FOR GRADIENT AMPLIFIER CONTROL

(71) Applicant: General Electric Company, Schenectady, NY (US)

(72) Inventors: Fei Xu, Shanghai (CN); Tao Ma, Shanghai (CN); Xi Lu, Shanghai (CN); Xinhui Wu, Shanghai (CN); Yimeng Shi, Hangzhou (CN); Pengcheng Zhu, Shanghai (CN); Garron Koch Morris, Whitefish Bay, WI (US); Juan Antonio Sabate, Gansevoort, NY (US); Jeffrey Neal Slotnick, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 577 days.

(21) Appl. No.: 13/659,337

(22) Filed: Oct. 24, 2012

(65) Prior Publication Data
US 2013/0099788 A1   Apr. 25, 2013

(30) Foreign Application Priority Data
Oct. 25, 2011   (CN) .......................... 2011 1 0326613

(51) Int. Cl.
*G01V 3/00* (2006.01)
*G01R 33/385* (2006.01)
*H02M 3/337* (2006.01)

(52) U.S. Cl.
CPC ......... *G01R 33/3852* (2013.01); *H02M 3/3376* (2013.01); *Y02B 70/1433* (2013.01)

(58) Field of Classification Search
CPC .................................................. G01R 33/3852
USPC .......................................................... 324/322
See application file for complete search history.

(56) References Cited

U.S. PATENT DOCUMENTS 4,464,709 A   8/1984   Barter
4,475,149 A   10/1984  Gallios
(Continued)

FOREIGN PATENT DOCUMENTS

CN   1745315 A   3/2006
CN   1862902 A   11/2006
(Continued)

OTHER PUBLICATIONS

Unofficial English translation of Office Action issued in connection with corresponding CN Application No. 201110326613.0 on Aug. 4, 2014.
(Continued)

*Primary Examiner* — Rodney Fuller
(74) *Attorney, Agent, or Firm* — GE Global Patent Operation; Marc A. Vivenzio

(57) ABSTRACT

A gradient amplifier for driving a gradient coil is disclosed. The gradient amplifier includes a direct current (DC) bus for receiving DC voltage generated from a series resonant converter, an inverter coupled to the DC bus configured to receive the DC voltage at the DC bus and convert the DC voltage to generate an output voltage to be applied to the gradient coil, and an inverter controller coupled to the inverter. The inverter controller is configured to generate control signals to control operation of the inverter based at least on a DC voltage feedback signal measured at the DC bus, an output voltage feedback signal measured at the output of the inverter, and a reference output voltage signal indicative of a desired voltage to be achieved at the output of the inverter.

15 Claims, 11 Drawing Sheets

(56) References Cited

U.S. PATENT DOCUMENTS

| | | | |
|---|---|---|---|
| 4,648,017 A | 3/1987 | Nerone | |
| 4,670,832 A | 6/1987 | Park | |
| 4,672,528 A | 6/1987 | Park et al. | |
| 4,769,754 A | 9/1988 | Reynolds et al. | |
| 4,815,052 A | 3/1989 | Walker | |
| 4,855,888 A * | 8/1989 | Henze et al. | 363/17 |
| 4,864,479 A | 9/1989 | Steigerwald et al. | |
| 4,868,728 A | 9/1989 | Nuns | |
| 4,897,775 A | 1/1990 | Klaassens | |
| 4,951,185 A * | 8/1990 | Schutten et al. | 363/17 |
| 5,140,510 A | 8/1992 | Myers | |
| 5,450,306 A | 9/1995 | Garces et al. | |
| 5,504,668 A | 4/1996 | Beyerlein et al. | |
| 5,534,766 A | 7/1996 | Bonissone et al. | |
| 5,646,835 A | 7/1997 | Katcha | |
| 5,663,647 A * | 9/1997 | Wirth et al. | 324/322 |
| 6,178,099 B1 * | 1/2001 | Schutten et al. | 363/17 |
| 6,351,401 B1 | 2/2002 | Scheel et al. | |
| 7,133,300 B1 * | 11/2006 | Yang | 363/56.11 |
| 7,180,975 B2 | 2/2007 | Heuscher et al. | |
| 7,253,625 B2 * | 8/2007 | Trabbic et al. | 324/322 |
| 7,321,262 B2 | 1/2008 | Nielsen et al. | |
| 7,324,361 B2 | 1/2008 | Siri | |
| 7,339,806 B2 | 3/2008 | Hsieh | |
| 7,379,309 B2 | 5/2008 | Isurin | |
| 7,397,248 B2 | 7/2008 | Lenz | |
| 2003/0142513 A1 | 7/2003 | Vinciarelli | |
| 2009/0052209 A1 | 2/2009 | Kaitani et al. | |
| 2009/0309598 A1 * | 12/2009 | Zhu et al. | 324/322 |
| 2011/0074413 A1 * | 3/2011 | Venkatesa | 324/309 |
| 2011/0211376 A1 * | 9/2011 | Hosotani | 363/97 |
| 2013/0099590 A1 | 4/2013 | Ma et al. | |
| 2013/0099787 A1 * | 4/2013 | Lu et al. | 324/319 |

FOREIGN PATENT DOCUMENTS

| | | |
|---|---|---|
| CN | 1881781 A | 12/2006 |
| CN | 200980048 Y | 11/2007 |
| CN | 101951174 A | 1/2011 |
| CN | 102193509 A | 9/2011 |
| EP | 0784374 A2 | 7/1997 |
| EP | 1850468 A2 | 10/2007 |
| GB | 2359151 A | 8/2001 |
| JP | 2000050529 A | 2/2000 |

OTHER PUBLICATIONS

Natarajan, K.; Sivakumar, S., "Optimal Trajectory Control of Constant Frequency Series Resonant Converter." 24th Annual Power Electronics Specialists Conference. Jun. 20-24, 1993, pp. 215-221 Location: Seattle, WA, USA.

Nikolay Bankov,Tsvetana Gngorova. "Load Characteristics and Control System Behavioural Modelling under Optimal Trajectory Control of Series Resonant DC/DC Converters." Journal of Electrical Engineering.2005.vol. 56, Issue 09-10, pp. 258-264.

Unofficial English Translation of Chinese Office Action and Search Report issued in connection with corresponding CN Application No. 201110326627.2 on Sep. 17, 2014.

Lee, et al., "Adaptive Harmonic Control in PWM Inverters with Fluctuating Input Voltage", IEEE Trans. on Power Electronics, vol. IE-33, Issue No. 1, pp. 92-98, Feb. 1986.

Funabiki, "A Control Strategy of Three-Phase PWM Inverter with Fluctuating Input Voltage", Proceedings of the IEEE IAS Annual Meeting, vol. 1, pp. 1170-1175, Oct. 1989.

Enjeti, et al., "A New Technique to Reject DC-Link Voltage Ripple for Inverters Operating on Programmed PWM Waveforms", IEEE Trans. on Power Electronics, vol. 7, Issue No. 1, pp. 171-180, Jan. 1992.

Ryan, et al., "A High Performance Sine Wave Inverter Controller with Capacitor Current Feedback and Back-EMF Decoupling", Proceedings of the IEEE Power Electronics Specialists Conference, vol. 1, pp. 507-513, Jun. 1995.

Jain , et al., "An Optimized Single-Phase AC Power Supply with DC Bus Synchronization", Proceedings of the IEEE Applied Power Electronics Conference and Exposition, vol. 2, pp. 3-7, Mar. 1996.

Pande, et al., "Output Voltage Integral Control Technique for Compensating Nonideal DC Buses in Voltage Source Inverters", IEEE Trans. on Power Electronics, vol. 12, Issue No. 2, pp. 302-310, Mar. 1997.

Ryan, et al., "Control Topology Options for Single-Phase UPS Inverters", IEEE Trans. on Industry Applications, vol. 33, Issue No. 2, pp. 493-501, Mar./Apr. 1997.

Pande, et al., "Modulated Integral Control Technique for Compensating Switch Delays and Nonideal DC Buses in Voltage-Source Inverters", IEEE Trans. on Industrial Electronics, vol. 44, Issue No. 2, pp. 182-190, Apr. 1997.

Karlsson, et al., "DC Bus Voltage Control for a Distributed Power System", IEEE Trans. on Power Electronics, vol. 18, Issue No. 6, pp. 1405-1412, Nov. 2003.

Luo, "Design of the High Voltage Pulse Power Supply Based on the LLC Series-Parallel Resonant Converter", Instrument Science and Technology, May 2010, 71 pages.

Wu, et al., "One Improved Optimal Trajectory Control Strategy", Power Electronic Technology, vol. 45, Issue No. 3, pp. 1-3, Mar. 31, 2011.

Unofficial English Translation of Chinese Office Action and Search Report issued in connection with corresponding CN Application No. 201110326612.6 on Sep. 2, 2014.

Unofficial English Translation of Chinese Office Action and Search Report issued in connection with corresponding CN Application No. 201110326613.0 on Mar. 17, 2015.

\* cited by examiner

US 9,322,890 B2

SYSTEM AND METHOD FOR GRADIENT AMPLIFIER CONTROL

BACKGROUND OF THE INVENTION

Embodiments of the present invention relate to systems and methods for power supply control.

Series resonant converters are one of the switching type power converters that have been widely used in a variety of industrial applications such as communication, medical, welding and so on. Typically, the series resonant converter can be operated to convert unregulated power received from a power source to regulated power which is applied to a load. The series resonant converter utilizes a number of switching devices arranged with half-bridge or full-bridge configurations that can be gated on or off to perform the power regulation. Conventionally, a frequency control is employed to control operation of the series resonant converter. That is, the frequency of the switching signals is varied with respect to the resonant frequency of a resonant tank circuit of the series resonant converter to achieve the desired output voltage from the series resonant converter. However, varying the frequency of the switching signals may cause difficulties in design of magnetic components and filters in association with the series resonant converter. Further, when input power or output load varies, desired output voltage cannot be achieved through the use of conventional control techniques.

BRIEF DESCRIPTION OF THE INVENTION

According to an embodiment of the present invention, a gradient amplifier for driving a gradient coil is provided. The gradient amplifier comprises a direct current (DC) bus for receiving DC voltage provided from a series resonant converter, an inverter coupled to the DC bus configured to receive the DC voltage at the DC bus and convert the DC voltage to generate an output voltage to be applied to the gradient coil, and an inverter controller coupled to the inverter, wherein the inverter controller is configured to generate control signals to control operation of the inverter based at least on a DC voltage feedback signal measured at the DC bus, an output voltage feedback signal measured at the output of the inverter, and a reference output voltage signal indicative of a desired voltage to be achieved at the output of the inverter.

According to another embodiment of the present invention, a method of operating a gradient amplifier to drive a gradient coil is provided. The method comprises receiving an DC voltage feedback signal representing an input DC voltage at a DC bus of the gradient amplifier, generating a compensation signal according to the DC voltage feedback signal and a nominal DC voltage signal indicative of a desired DC voltage to be achieved at the DC bus of the gradient amplifier, receiving an output voltage feedback signal and a reference output voltage signal, generating a regulator signal according to the output voltage feedback signal and the reference output voltage signal, and generating control signals to be applied to an inverter of the gradient amplifier based at least on the compensation signal and the regulator signal.

According to another embodiment of the present invention, a magnetic resonance system is provided. The system comprises a main magnet for generating a main magnetic field, a gradient coil for applying gradient magnetic field to the main magnetic field along selected gradient axes, and a gradient amplifier coupled to the gradient coil for driving the gradient coil. The gradient amplifier comprises a direct current (DC) bus for receiving a DC voltage, an inverter coupled to the DC bus configured to receive the DC voltage from the DC bus and convert the DC voltage to generate an output voltage to be applied to the gradient coil; and an inverter controller coupled to the inverter, wherein the inverter controller is configured to generate control signals to control operation of the inverter based at least on a DC voltage feedback signal measured at the DC bus, an output voltage feedback signal measured at the output of the inverter, and a reference output voltage signal indicative of a desired voltage to be achieved at the output of the inverter.

BRIEF DESCRIPTION OF THE DRAWINGS

These and other features and aspects of embodiments of the present disclosure will become better understood when the following detailed description is read with reference to the accompanying drawings in which like characters represent like parts throughout the drawings, wherein.

DETAILED DESCRIPTION OF EXEMPLARY EMBODIMENTS OF THE INVENTION

Figure 1:
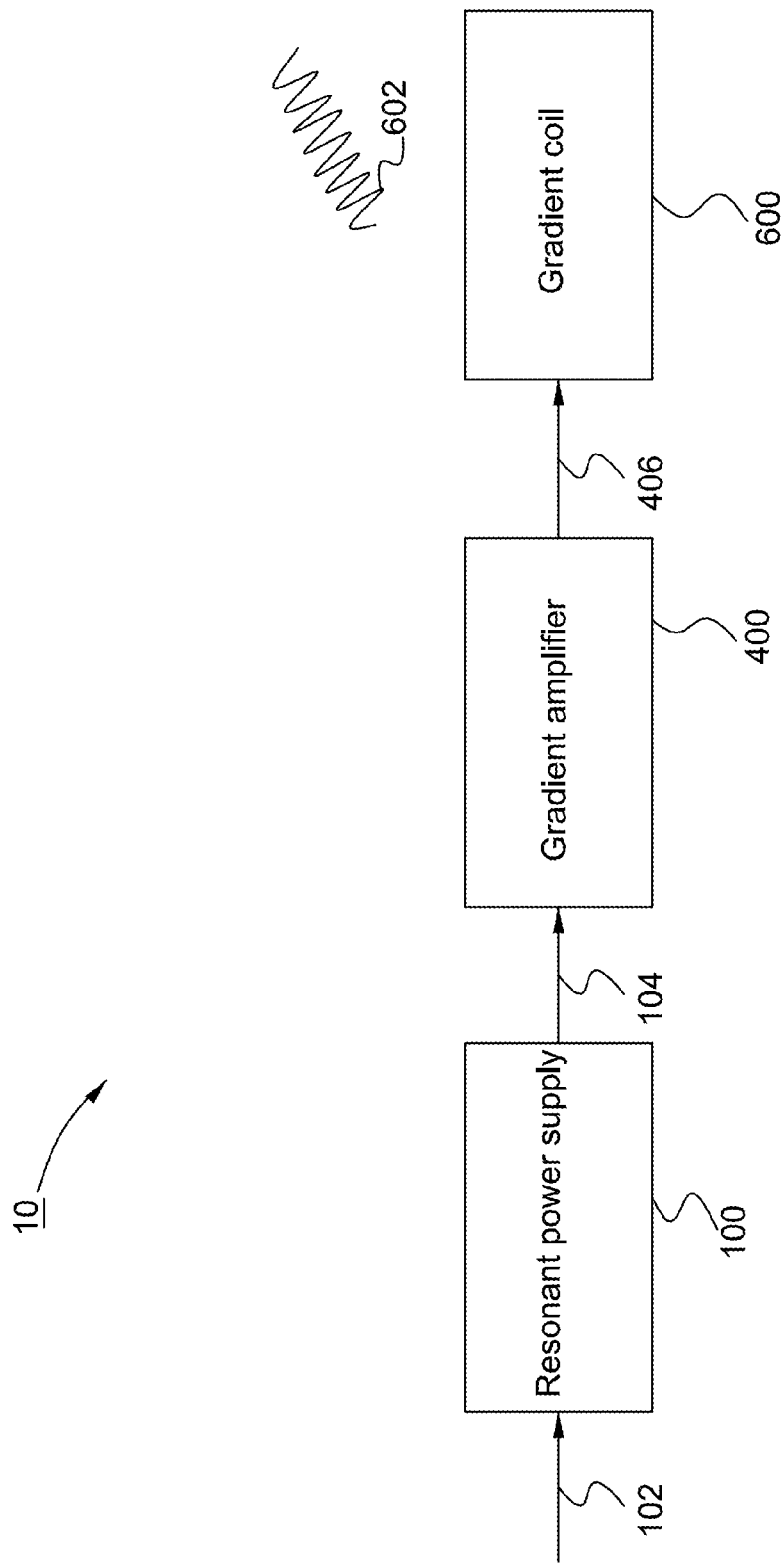
FIG. 1 is a block diagram of a magnetic resonance system in accordance with an exemplary embodiment of the present disclosure.

Exemplary embodiments disclosed herein relate to power supplies for supplying regulated power to a load. More specifically, a series resonant converter type power supply may be incorporated in a magnetic resonance imaging (MRI) system for supplying power to a gradient amplifier so as to enable the gradient amplifier to drive a gradient coil to generate gradient field to facilitate image acquisition. In particular, the power converted from the series resonant converter is regulated using a fixed frequency control algorithm. As used herein, "fixed frequency control algorithm" refers to the switching frequency of the switching devices used in the series resonant converter that is maintained at a constant value even when the input voltage to be regulated has fluctuations and the regulated voltage is experiencing transient conditions. In one implementation, the control is achieved by adjusting a phase delay between the switching signals for driving the switching devices in the series resonant converter. To make the series resonant converter respond quickly to load transient conditions, the "fixed frequency control algorithm" is designed to have two control loops. The first control loop is an average trajectory radius loop and the second control loop is a voltage loop. The average trajectory radius loop which is also an inner loop can be designed to have high bandwidth to make the series resonant converter respond quickly to load transient conditions and eliminate the impact of voltage fluctuations on regulated output voltage. The second voltage loop which is an outer loop serves to regulate the output voltage according to commanded voltage signals. In some embodiments, an over-voltage protection mechanism and an over-current protection mechanism may be additionally or optionally included in the series resonant converter for protecting the series resonant converter from over-voltage and over-current problems. As can be understood, the over-voltage protection and over-current protection mechanisms can provide soft protection to the power supply without shutting down the power supply, which makes the power supply more stable. Another exemplary embodiment disclosed herein relates to compensating the voltage fluctuations of the input voltage applied to the gradient amplifier for driving the gradient coil.

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean either or all of the listed items. The use of "including," "comprising," or "having," and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. Furthermore, the terms "circuit", "circuitry", and "controller" may include either a single component or a plurality of components, which are either active and/or passive and are connected or otherwise coupled together (e.g., as one or more integrated circuit chips) to provide the described function.

FIG. 1 illustrates a block diagram of a sub-system 20 of a magnetic resonance system in accordance with an exemplary embodiment of the present disclosure. The sub-system 20 includes a resonant power supply 100 for receiving input power 102 from a power source (not shown) and regulating the input power 102 to provide output power 104. The output power 104 is supplied to a gradient amplifier 400 which drives one or more gradient coils 600 (e.g., three gradients coils) to generate a gradient field 602 to facilitate image acquisition of the magnetic resonance system. In an embodiment, the resonant power supply 100 includes a series resonant converter that is operated to convert the input power 102 in the form of unregulated DC voltage to the output power 104 in the form of regulated DC voltage. As will be appreciated by those skilled in the art, FIG. 1 generally illustrates one of the applications that the resonant power supply 100 can be used to supply power to one or more components of the system. It is not intended to limit the application to magnetic resonance system, and the resonant power supply 100 can be used to supply power in other applications such as communication, medical, welding and so on.

Figure 2:
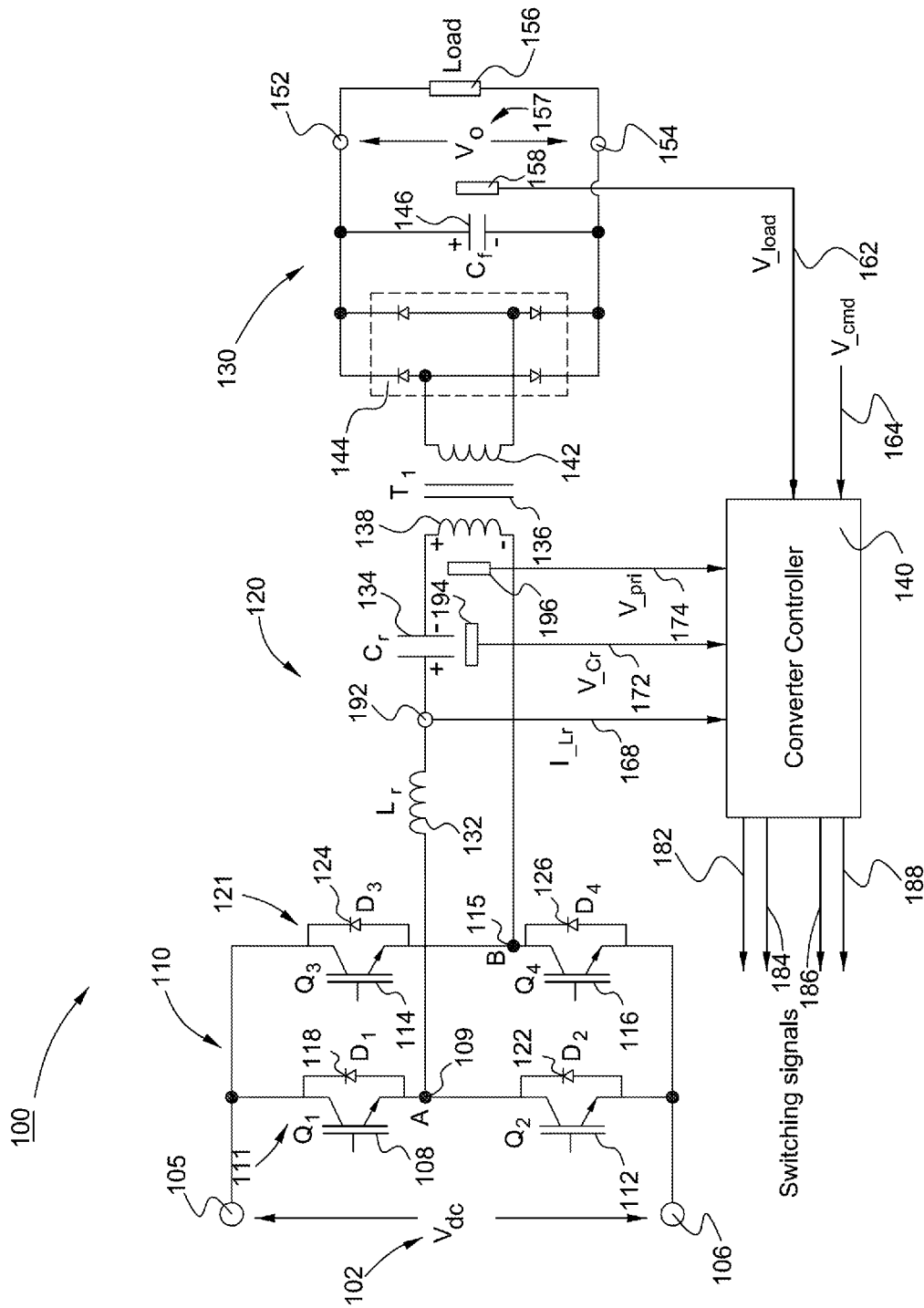
FIG. 2 is a schematic block diagram of a resonant power supply shown in FIG. 1 in accordance with an exemplary embodiment of the present disclosure.

FIG. 2 is a schematic block diagram of the resonant power supply 100 shown in FIG. 1 in accordance with an exemplary embodiment of the present disclosure. In general, the resonant power supply 100 shown in FIG. 2 includes a switching stage 110, a resonant tank circuit 120, an isolation transformer 136, an output stage 130, and a converter controller 140. The switching stage 110 receives input DC voltage 102 at two input terminals 105, 106 and selectively supplies the DC voltage 102 to the resonant tank circuit 120 according to the control signals sent from the converter controller 140. The isolation transformer 136 serves to separate the resonant tank circuit 120 from the output stage 130. The isolation transformer 136 includes a primary winding 138 and a secondary winding 142. The primary winding 138 is coupled to the resonant tank circuit 120, and the secondary winding 142 is coupled to the output stage 130. The output stage 130 outputs a regulated DC voltage 157 at two output terminals 152, 154 and the regulated DC voltage 157 is applied to a load 156. In one embodiment, the load 156 is the gradient amplifier 400 as shown in FIG. 1.

In an embodiment, the switching stage 110 is arranged with a full-bridge configuration and includes four switching elements 108, 112, 114, 116 and four diodes 118, 122, 124, 126. The switching elements 108, 112, 114, 116 may be any suitable type of solid state switching devices, such as insulated gate bipolar transistors (IGBTs) and metal oxide semi-conductor field effect transistors (MOSFETs). Each of the diodes 118, 122, 124, 126 is respectively coupled with each of the switching elements 108, 112, 114, 116 in an anti-parallel configuration. The first switching element 108 and the second switching element 112 are coupled in series in a first converter leg 111 which may be referred to as a lag leg. The third switching element 114 and the fourth switching element 116 are coupled in series in a second converter leg 121 which may be referred to as a lead leg. As used herein, "lead" refers to the switching elements in the corresponding phase leg that initially change their switching state during a switching cycle, and "lag" refers to the switching elements in the corresponding leg that change their switching state with a phase delay with respect to the lead leg. In an embodiment, as will described below in reference to FIG. 2, the two switching elements 108, 112 in the lag leg 111 are operated in a complementary manner, that is, when the first switching element 108 is gated on, the second switching element 112 is gated off. Similarly, the two switching elements 114, 116 in the lead leg 121 are also operated in a complementary manner. In other embodiments, the switching stage 110 may be implemented to have a half-bridge configuration and any other suitable topologies as is known in the art.

With continued reference to FIG. 2, in one implementation, the resonant tank circuit 120 is coupled between a first node 109 (A) and a second node 115 (B), where the first node 109 is a joint connection between the first switching element 108 and the second switching element 112, and the second node 115 is a joint connection between the third switching element 114 and the fourth switching element 116. The resonant tank circuit 120 includes a resonant inductor 132 and a resonant capacitor 134. The resonant inductor 132, the resonant capacitor 134 and the primary winding 138 of the isolation transformer 136 are in series connected between the first node 109 and the second node 115.

In an implementation, the output stage 130 includes a full-bridge rectifier 144 coupled to the secondary winding 142 of the isolation transformer 136. The full-bridge rectifier 144 is configured to rectify the voltage generated across the second winding 142 of the isolation transformer 136. The output stage 130 may further include an output capacitor 146 coupled in parallel with the full-bridge rectifier 144. The output capacitor 146 functions as a low pass filter for removing ripple signals in the DC voltage rectified by the full-bridge rectifier 144. In other embodiments, the output stage 130 may be implemented without using the output capacitor 146.

With continued reference to FIG. 2, the converter controller 140 is coupled to a plurality of sensors for monitoring various state variables in association with the series resonant converter 100. The converter controller 140 is further coupled to the switching stage 110 for supplying switching signals 182, 184, 186, 188 to control operation of the switching devices 108, 112, 114, 116 in the switching stage 110. In an implementation, the switching signals 182, 184, 186, 188 are generated by implementing a trajectory control according to the monitored state variables and command signals. As used herein, "trajectory control" refers to determining an instantaneous state of the series resonant converter according to various state variables. In one embodiment, the state variables may include a resonant inductor current flowing through the resonant inductor 132, a resonant capacitor voltage at the resonant capacitor 134, and a primary winding voltage at the primary winding 138. The resonant inductor current can be sensed by a current sensor 192 which provides a resonant inductor current signal 168 to the converter controller 140. The resonant capacitor voltage can be sensed by a first voltage sensor 194 which provides a resonant capacitor voltage signal 172 to the converter controller 140. The primary voltage can be sensed by a second voltage sensor 196 which provides a primary voltage signal 174 to the converter controller 140. The converter controller 140 further receives an output voltage feedback signal 162 sensed by a voltage sensor 158 and a voltage command signal 164 which indicates a desired voltage to be achieved at the output of the series resonant converter 100 for control operation of the series resonant converter 100.

Figure 3:
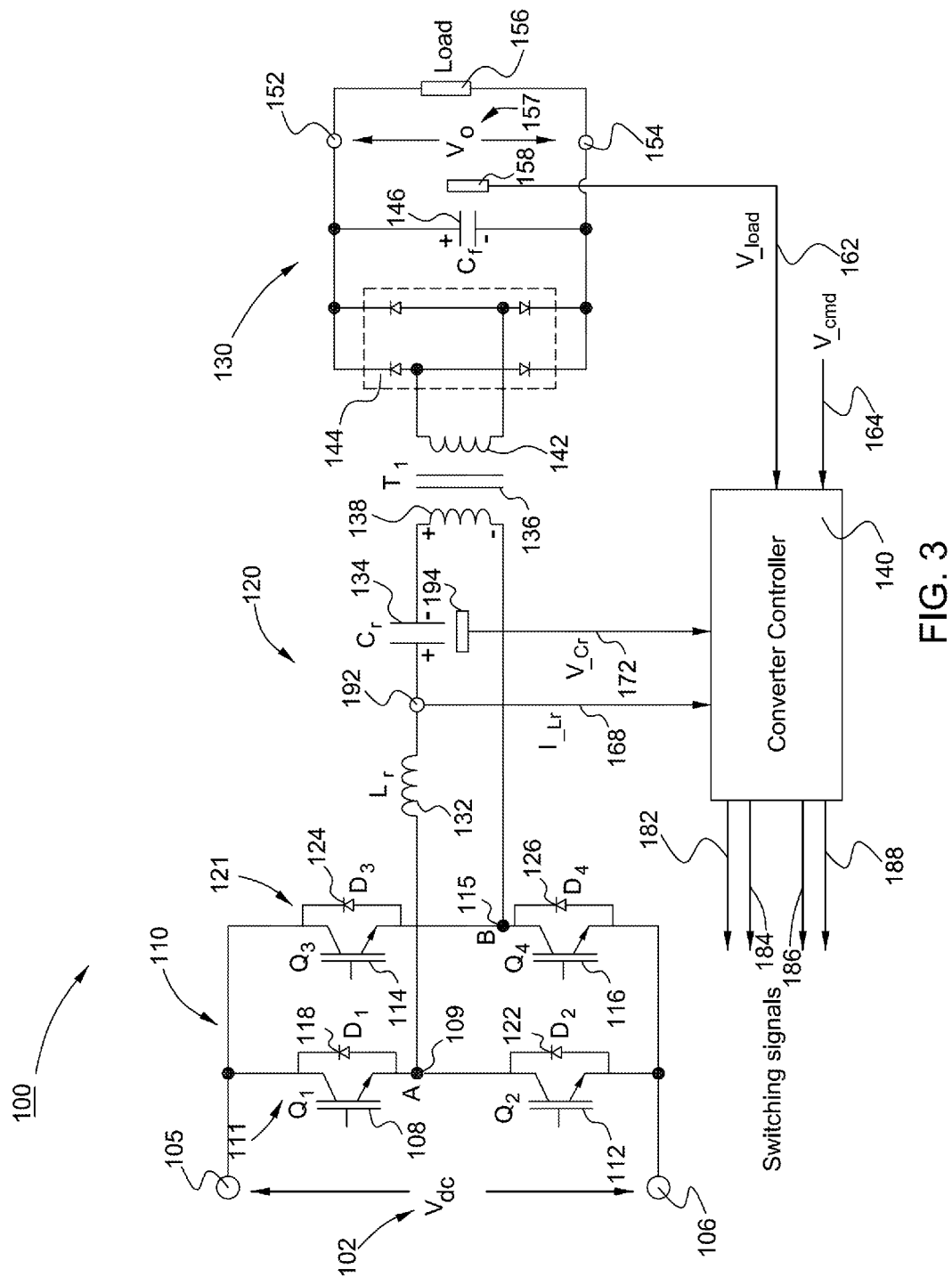
FIG. 3 is a schematic block diagram of a resonant power supply shown in FIG. 1 in accordance with an exemplary embodiment of the present disclosure.

In an alternative embodiment, as shown in FIG. 3, the state variables may include a resonant inductor current flowing through the resonant inductor 132, a resonant capacitor voltage at the resonant capacitor 134, and an output voltage at the output of the series resonant converter 100. The schematic block diagram shown in FIG. 3 is similar to the schematic control diagram shown in FIG. 2. One of the differences is that the voltage sensor 196 for monitoring the primary voltage at the primary winding of the isolation transformer 136 is omitted in FIG. 3. In this embodiment, the converter controller 140 generates the switching signals 182, 184, 186, 188 according to the sensed resonant inductor current signal 168, resonant capacitor voltage signal 172, the output voltage feedback signal 162, and the voltage command signal 164. In an embodiment, the output voltage feedback signal is detected from the voltage applied to the load 156. In other embodiments, the output voltage feedback signal 162 can be the voltage appearing at the secondary winding 142 of the isolation transformer 136.

Figure 4:
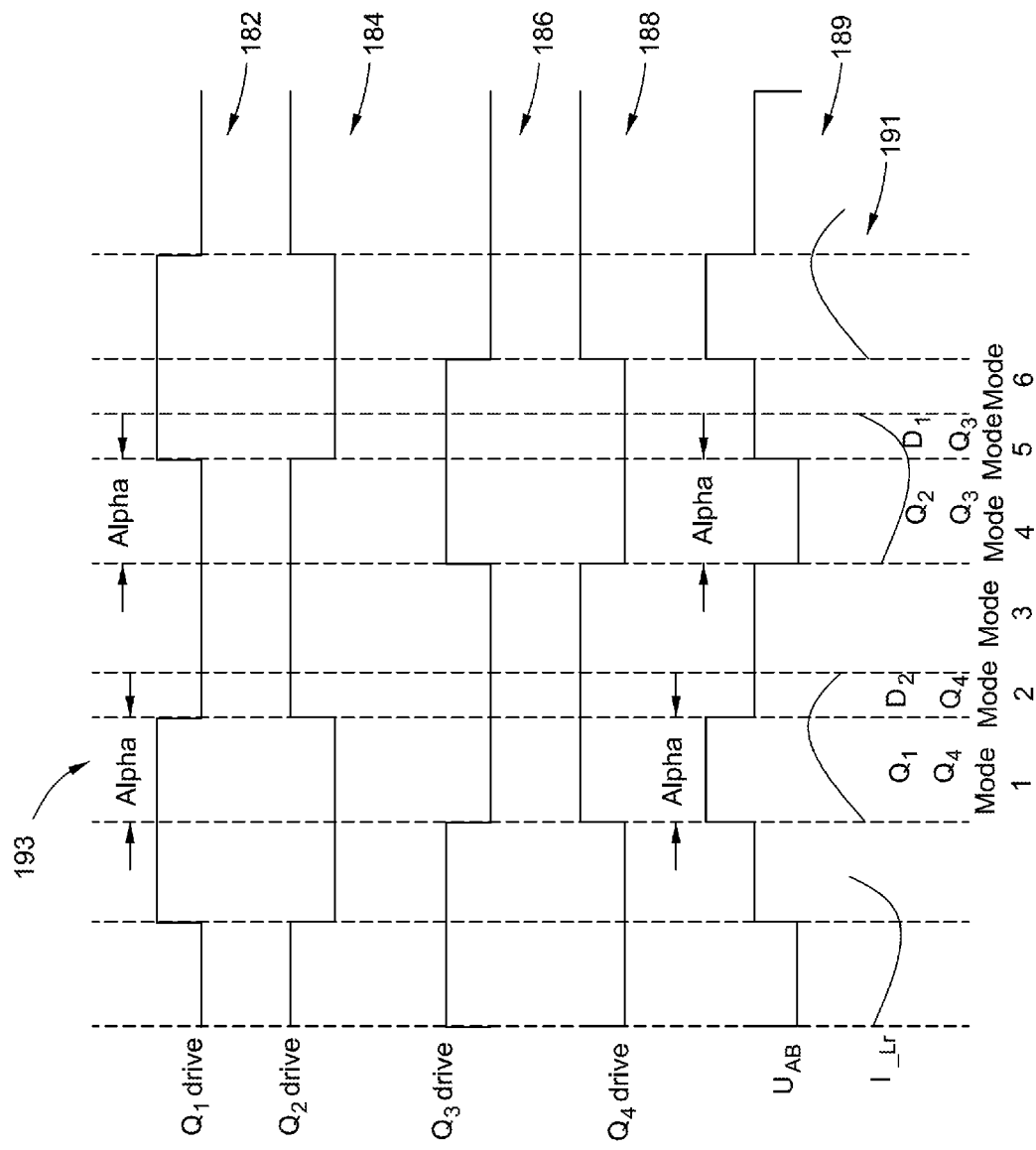
FIG. 4 is a timing diagram of various waveforms that are present in the resonant power supply shown in FIG. 2 and FIG. 3 in accordance with an exemplary embodiment of the present disclosure.

FIG. 4 is a timing diagram of various waveforms that are present in the resonant power supply 100 shown in FIG. 2 and FIG. 3 in accordance with an exemplary embodiment of the present disclosure. As shown in FIG. 4, a first waveform 182 and a second waveform 184 show the switching signals for driving the first switching device 108 and the second switching device 112 in the first converter leg 111 respectively. In an implementation, the first waveform 182 and the second waveform 184 are synchronized in a complementary manner, that is, when the first waveform 182 is on, the second waveform 184 is off and when the first waveform 182 is off, the second waveform 184 is on. Similarly, a third waveform 186 and a fourth waveform 188 show the switching signals for driving the third switching device 114 and fourth switching device 116 in the second converter leg 121 respectively. The third waveform 186 and the fourth waveform 188 have an adjustable phase delay 193 (Alpha) with respect to the first waveform 182 and the second waveform 184. Further, a voltage waveform 189 shows the voltage across the first node 109 and the second node 115, and a current waveform 191 shows the resonant current flowing through the resonant inductor 132 or the resonant tank circuit 120. In an implementation, as shown in FIG. 4, the voltage waveform 189 shows that the voltage between the first node 109 and the second node 115 has three values, positive input DC voltage 102, zero voltage, and negative input DC voltage 102. In an implementation, as shown in FIG. 4, the current waveform 191 indicates that the resonant current flowing through the resonant inductor 132 or the resonant tank circuit 120 changes in a nearly sinusoidal and discontinuous manner.

In an implementation, there are six modes of operation for the series resonant converter 100 using a phase shifted control. Further referring to FIG. 2 and FIG. 3, in the first mode, the first switching device 108 and the fourth switching device 116 are on, the voltage between the first node 109 and the second node 115 is equal to the positive input DC voltage 102, and the resonant current flowing through the resonant inductor 132 rises continuously in a nearly sinusoidal waveform. In the second mode, the first switching device 108 is turned off, the fourth switching device 116 is kept on, and the diode 112 (D2) is conducting for keeping the current flowing in a closed loop. During this period, the voltage between the first node 109 and the second node 115 is reduced to zero, and the current flowing through the resonant inductor 132 decreases gradually in a nearly sinusoidal waveform. After the resonant current reduces to zero, the states of four switching devices are kept unchanged to make the resonant current remain at zero for a certain time, which is the third mode. That is, the series resonant converter 100 is working in a current discontinuous mode. In the fourth mode, the second switching device 112 and the third switching device 114 are on, the voltage between the first node 109 and the second node 115 is equal to the negative input DC voltage 102, and the resonant current flows through the resonant inductor 132 in an opposite direction in a nearly sinusoidal waveform. In the fifth mode, the second switching device 112 is turned off, the third switching device 114 is kept on, and the diode 124 (D3) is conducting for keeping the current flowing in a closed loop. During this period, the voltage between the first node 109 and the second node 115 is reduced to zero, and the current also flows through the resonant inductor 132 in a nearly sinusoidal waveform. After the resonant current reaches zero, the states of four switching devices are kept unchanged to make the resonant current remain at zero for certain time which is the sixth mode.

Figure 5:
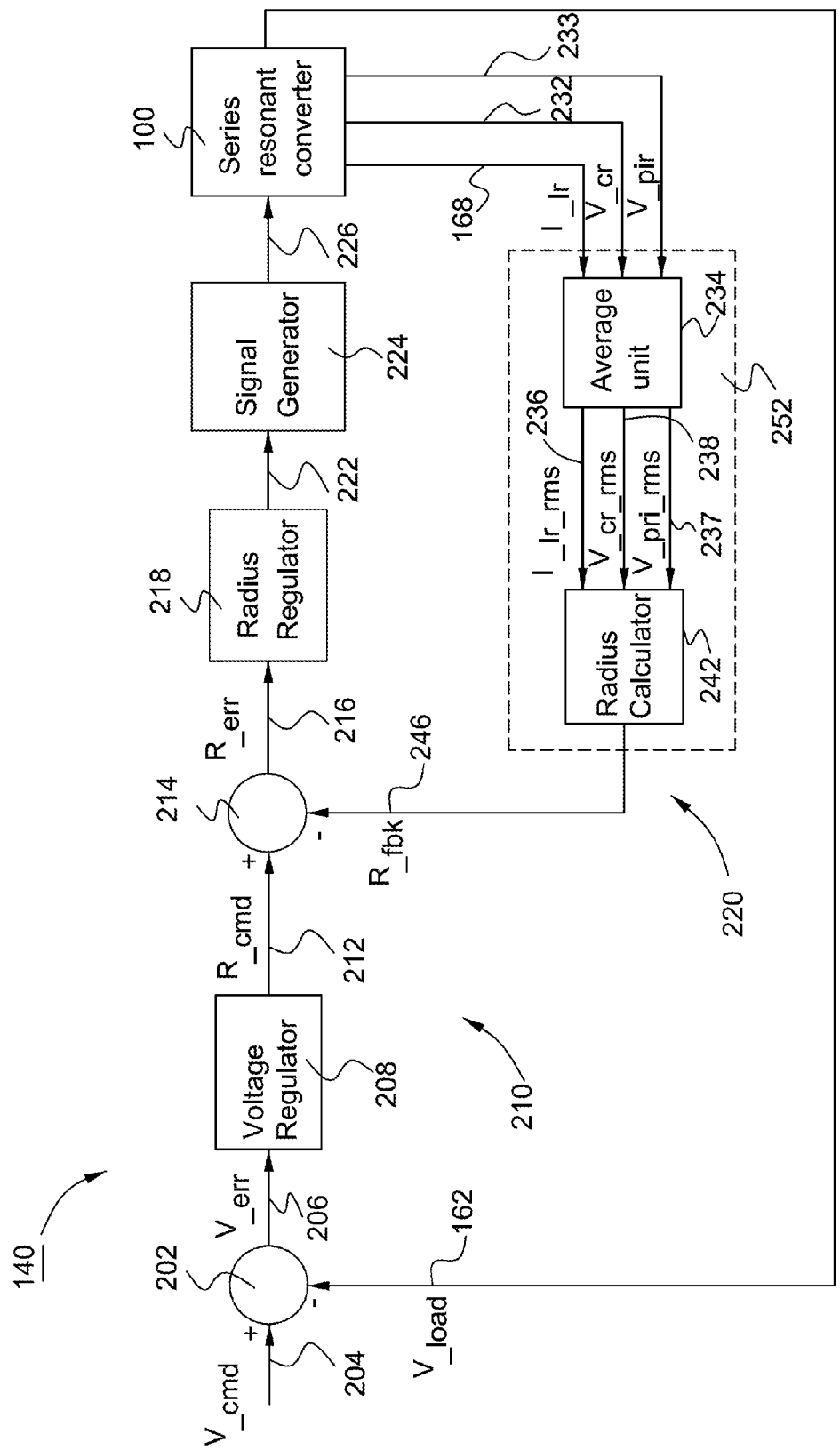
FIG. 5 is a detailed control diagram implemented in a converter controller shown in FIG. 2 in accordance with an exemplary embodiment of the present disclosure.

FIG. 5 is a detailed control diagram implemented in a converter controller 140 shown in FIG. 2 in accordance with one exemplary embodiment of the present disclosure. The various blocks illustrated in FIG. 5 can be implemented in hardware or software or a combination thereof. In practical applications, the converter controller 140 may be implemented by a micro-controller or a digital signal processor (DSP). The converter controller 140 may be a proportional-integral (PI) controller, a proportional controller, a state space controller, a non-linear controller, or any other suitable controllers. In general, the control diagram shown in FIG. 5 includes two control loops, that is, an outer loop 210 and an inner loop 220. The outer loop 210 is a voltage loop which is designed to regulate the output voltage or load voltage according to commanded voltage signals. More specifically, the converter controller 140 includes a summation element 202 that is configured to receive an output voltage feedback signal 162 from the output stage 130 of the series resonant converter 100. The summation element 202 also receives a voltage command signal 204 representative of the voltage to be achieved at the output of the output stage 130 of the series resonant converter 100. The summation element 202 subtracts the output voltage signal 162 from the voltage command signal 204 and derives a voltage error signal 206. The derived voltage error signal 206 is supplied to a voltage regulator 208 for generating a trajectory radius command signal 212 designed to drive the voltage error signal 206 to zero. The inner loop 220 is an average trajectory radius loop that is designed to regulate an actual trajectory radius signal according to the trajectory radius command signal 212. The trajectory radius command signal 212 represents the desired energy to be transmitted from the series resonant converter 100 to the load. More specifically, the converter controller 140 includes a processing module 252 that is used to calculate an actual trajectory radius according to the sensed resonant inductor current signal 168, the resonant capacitor voltage signal 232, and the primary winding voltage signal 233.

In an implementation, the processing module 252 includes an average unit 234 and a radius calculator 242 coupled to the average unit 234. The average unit 234 is configured to receive the resonant inductor current signal 168, the resonant capacitor voltage signal 232, and the primary winding voltage signal 233, and calculates an average resonant inductor current signal 236, an average resonant capacitor voltage signal 237, and an average primary winding voltage signal 238 accordingly. The resonant capacitor voltage 233 can be expressed according to the following equation:

$$V_{cr}(t) = (V_{dc} - V_{pri})\left\{1 - \cos\left(\frac{t}{\sqrt{L_r C_r}}\right)\right\},\quad \text{Eqn. 1}$$

where in Eqn. 1, $V_{cr}(t)$ is the resonant capacitor voltage 172, $V_{dc}$ is the input DC voltage 102, $V_{pri}$ is the primary voltage 174, $L_r$ is the inductance of the resonant inductor 132, $c_r$ is the capacitance of the resonant capacitor 134. The resonant inductor current 168 can be expressed according to the following equation:

$$I_{Lr}(t) = \frac{(V_{dc} - V_{pri})}{\sqrt{L_r C_r}} \sin\left(\frac{t}{\sqrt{L_r C_r}}\right),\quad \text{Eqn. 2}$$

where in Eqn. 2, $I_{Lr}(t)$ is the resonant inductor current 168, $V_{dc}$ is the input DC voltage 102, $V_{pri}$ is the primary voltage 174, $L_r$ is the inductance of the resonant inductor 132, $C_r$ is the capacitance of the resonant capacitor 134. The solutions to the equations (1) and (2) are circles when drawn in a $V_{cr}$–$Z_0 I_{Lr}$ state plane, where $Z_0$ is the characteristic impedance of the resonant tank circuit 120 and can be expressed according to the following equation:

$$Z_0 = \sqrt{\frac{L_r}{C_r}},\quad \text{Eqn. 3}$$

Where in Eqn. 3, $L_r$ is the inductance of the resonant inductor 132, $c_r$ is the capacitance of the resonant capacitor 134.

In an implementation, the average unit 234 employs a low pass filter for generating root mean square values of the received resonant inductor current signal 168, resonant capacitor voltage signal 232, and primary winding voltage signal 233. The radius calculator 242 is configured to calculate the actual trajectory radius signal 246 according to the average resonant current signal 236, the average resonant capacitor voltage signal 237, and the average primary winding voltage 238. More particularly, the radius calculator 242 employs a control law for calculating a radius distance squared from the point $(-V_{pri}, 0)$ in the $V_{cr}$–$Z_0 I_{Lr}$ state plane. In an implementation, the actual trajectory radius signal 246 is calculated by the radius calculator 242 according to the following equation:

$$\text{RADIUS}^2 = (Z_0 * I_{Lr})^2 + (V_{cr} + V_{pri})^2 \quad \text{Eqn. 4,}$$

Where in Eqn. 4, $Z_0$ is the characteristic impedance of the resonant inductor 132 and the resonant capacitor 134, $I_{Lr}$ is the resonant inductor current 236, $V_{Cr}$ is the resonant capacitor voltage 237, $V_{pri}$ is the primary winding voltage 238, and RADIUS is the average radius of the state trajectory.

The converter controller 140 further includes a second summation element 214 for receiving the trajectory radius command signal 212 as a positive input and the actual trajectory radius signal 236 as a negative input. The second summation element 214 subtracts the actual trajectory radius signal 236 and the trajectory radius command signal 212, and derives a radius error signal 216, which is supplied to the radius regulator 218. The radius regulator 218 generates a modulation index signal 222 according to the radius error signal 216. In one implementation, the modulation index signal 222 includes a phase delay between the lead leg 121 and the lag leg 111 as shown in FIG. 2. The modulation index signal 222 is supplied to the signal generator 224 for generation of the driving signals that are used to drive the switching devices in the switching stage 110 shown in FIG. 2.

Figure 6:
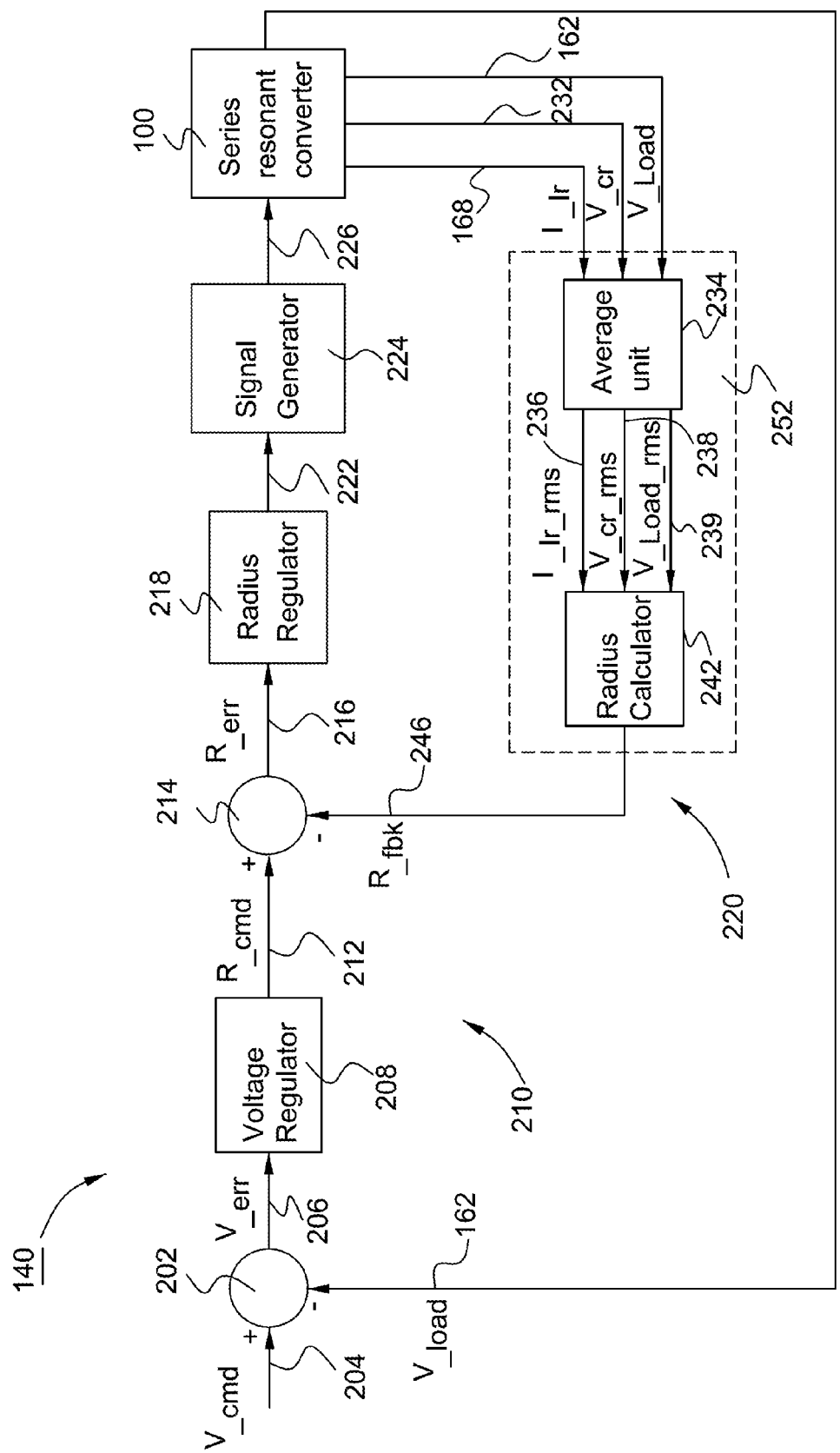
FIG. 6 is a detailed control diagram implemented in the converter controller shown in FIG. 3 in accordance with an exemplary embodiment of the present disclosure.

FIG. 6 is a detailed control diagram implemented in the converter controller 140 shown in FIG. 3 in accordance with one exemplary embodiment of the present disclosure. The control diagram shown in FIG. 6 is similar to the control diagram shown in FIG. 5. One of the differences is that the output voltage or the load voltage generated from the output stage 130 of the series resonant converter 100 is used in calculation of the actual trajectory radius signal 246 instead of using a primary voltage 233. Correspondingly, the average unit 234 processes the output voltage feedback signal 162 to generate an average output voltage signal 239. In one implementation, the actual trajectory radius signal 246 is calculated by the radius calculator 242 according to the following equation:

$$RADIUS^2 = (Z_0 * I_{Lr})^2 + \left(V_{Cr} + \frac{V_{load}}{N}\right)^2, \quad \text{Eqn. 5}$$

for: $I_{Lr} > 0$, $$RADIUS^2 = (Z_0 * I_{Lr})^2 + \left(V_{Cr} - \frac{V_{load}}{N}\right)^2, \quad \text{Eqn. 6}$$

for: $I_{Lr} < 0$, where in the Eqns. 5 and 6, $Z_0$ is the characteristic impedance of the resonant inductor 132 and the resonant capacitor 134, $I_{Lr}$ is the resonant inductor current 236, $V_{Cr}$ is the resonant capacitor voltage 239, $V_{load}$ is the output voltage 162, N is the turn ratio of the isolation transformer 136, and RADIUS is the average radius of the state trajectory.

Figure 7:
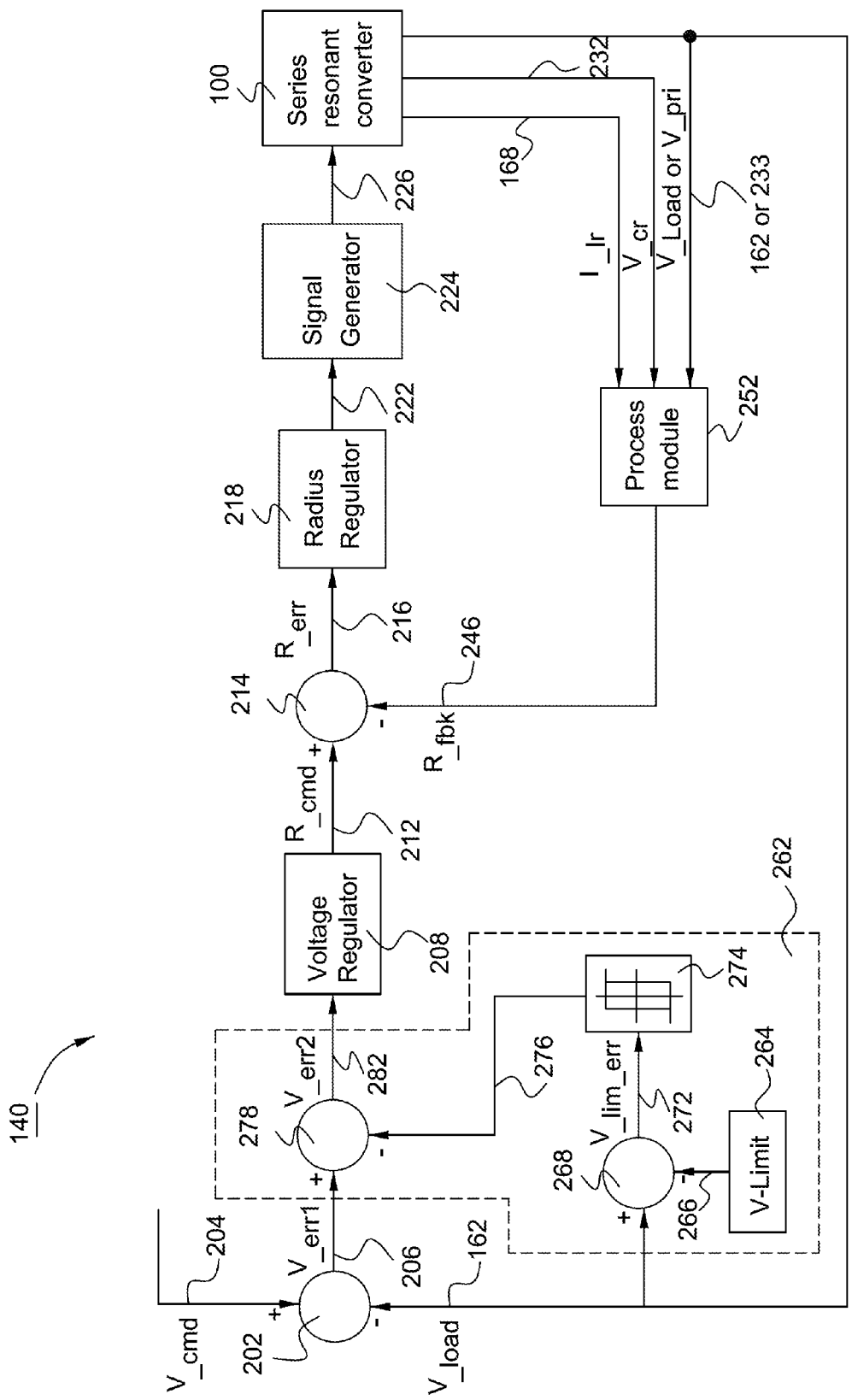
FIG. 7 is a detailed control diagram implemented in the converter controller shown in FIG. 2 or FIG. 3 in accordance with an exemplary embodiment of the present disclosure.

FIG. 7 is a detailed control diagram implemented in the converter controller 140 shown in FIG. 2 or FIG. 3 in accordance with another exemplary embodiment of the present disclosure. The control diagram shown in FIG. 7 is similar to the control diagrams shown in FIG. 5 and FIG. 6. One of the differences is that the converter controller 140 shown in FIG. 7 further includes a voltage limit module 262. In general, the voltage limit module 262 is provided for limiting transient voltage conditions such as over voltage conditions related to the output voltage of the series resonant converter 100. More specifically, the voltage limit module 262 is configured to modify the voltage error signal 206 when the output voltage signal 162 exceeds a threshold voltage.

In an implementation, as shown in FIG. 7, the voltage limit module 262 includes a voltage reference unit 264, a third summation element 268, a limiter 274, and a fourth summation element 278. The voltage reference unit 264 is configured to provide a voltage threshold signal 266 as a negative input to the third summation element 268, which also receives the output voltage signal 162 as a positive input. The resulted voltage error signal 272 representing a difference between the output voltage signal 162 and the voltage threshold signal 266 is supplied to the limiter 274, which may be set with an upper limit and a lower limit for limiting the voltage error signal 272. The limited voltage signal 276 is supplied as a negative input to the fourth summation element 278 which also receives the voltage error signal 206 as the positive input. The fourth summation element 278 subtracts the limited voltage signal 276 from the voltage error signal 206 and provides another voltage error signal 282 to the voltage regulator 208. In one implementation, the limiter 274 is configured to allow positive voltage error signal to pass through while block negative voltage error signal. In operation, when the output voltage exceeds the preset threshold voltage, that is, the output voltage signal 162 is greater than the threshold voltage signal 266, and the voltage error signal 272 is positive. The positive voltage error signal 272 passes through the limiter 274 and is supplied to the fourth summation element 278. When the output voltage falls below the preset threshold voltage, the output voltage signal 162 is smaller than the threshold voltage signal 266, and the voltage error signal 272 is negative. In this case, the limiter 274 blocks the negative voltage error signal 272.

Figure 8:
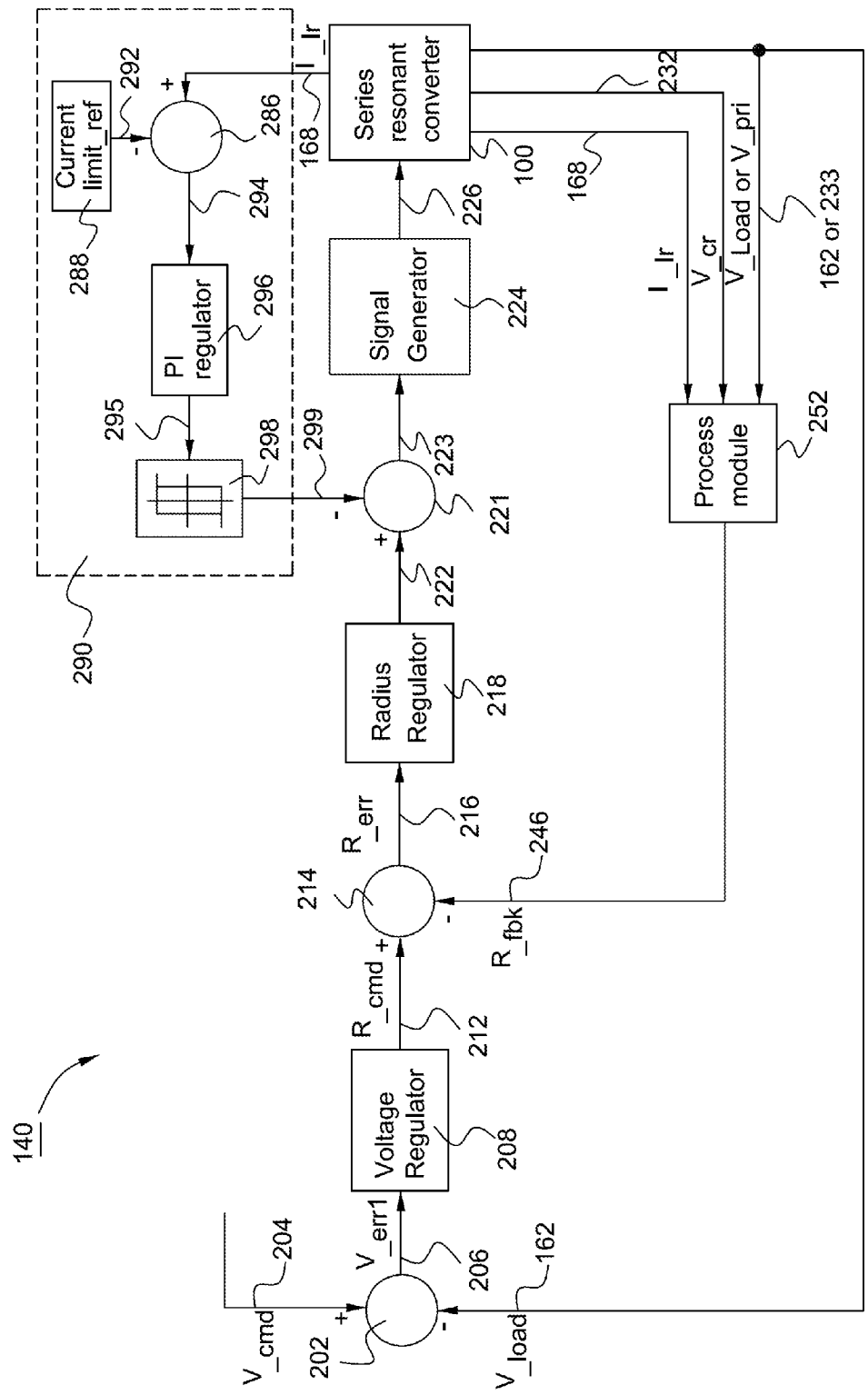
FIG. 8 is a detailed control diagram implemented in the converter controller shown in FIG. 2 or FIG. 3 in accordance with an exemplary embodiment of the present disclosure.

FIG. 8 is a detailed control diagram implemented in the converter controller 140 shown in FIG. 2 or FIG. 3 in accordance with yet another exemplary embodiment of the present disclosure. The control diagram shown in FIG. 8 is similar to the control diagrams shown in FIG. 5 and FIG. 6. One of the differences is that the converter controller 140 shown in FIG. 8 further includes a current limit module 290. In general, the current limit module 290 is provided for limiting over current conditions related to the resonant tank circuit 120.

In an implementation, as shown in FIG. 8, the current limit module 290 includes a fifth summation element 286, a current reference unit 288, a current regulator 296, and a limiter 298. The fifth summation element 286 is configured to receive the resonant inductor current signal 168 and a current threshold signal 292 provided from the current reference unit 288. The current threshold signal 292 indicates a maximum allowable current to be flowing through the resonant tank circuit 120. The resulted current error signal 294 representing a difference between the resonant inductor current signal 168 and the threshold current signal 292 is supplied to the current regulator 296. In one embodiment, the current regulator 196 is a PI controller. The current regulator 296 generates a modulation index correction signal 295 according to the current error signal 294. The modulation index correction signal 295 is limited by the limiter 298 which supplies a limited modulation index correction signal 299 to the sixth summation element 221. When the resonant inductor current exceeds the preset threshold value, that is, the resonant inductor current signal 168 is greater than the current threshold signal 292, the current error signal 294 will be positive. In such case, the modulation index signal 222 is reduced, and the signal generator 224 uses the reduced modulation index signal 222 to adjust the control signals 226 sent to the series resonant converter 228 so as to reduce the resonant inductor current flowing through the resonant tank circuit 120. When the resonant inductor current signal 168 is smaller than the current threshold signal 292, the current error signal 294 will be negative, and the limiter 298 will block the modulation index correction signal 295 provided from the current regulator 296, such that the modulation index signal 222 remains unchanged in this condition.

Figure 9:
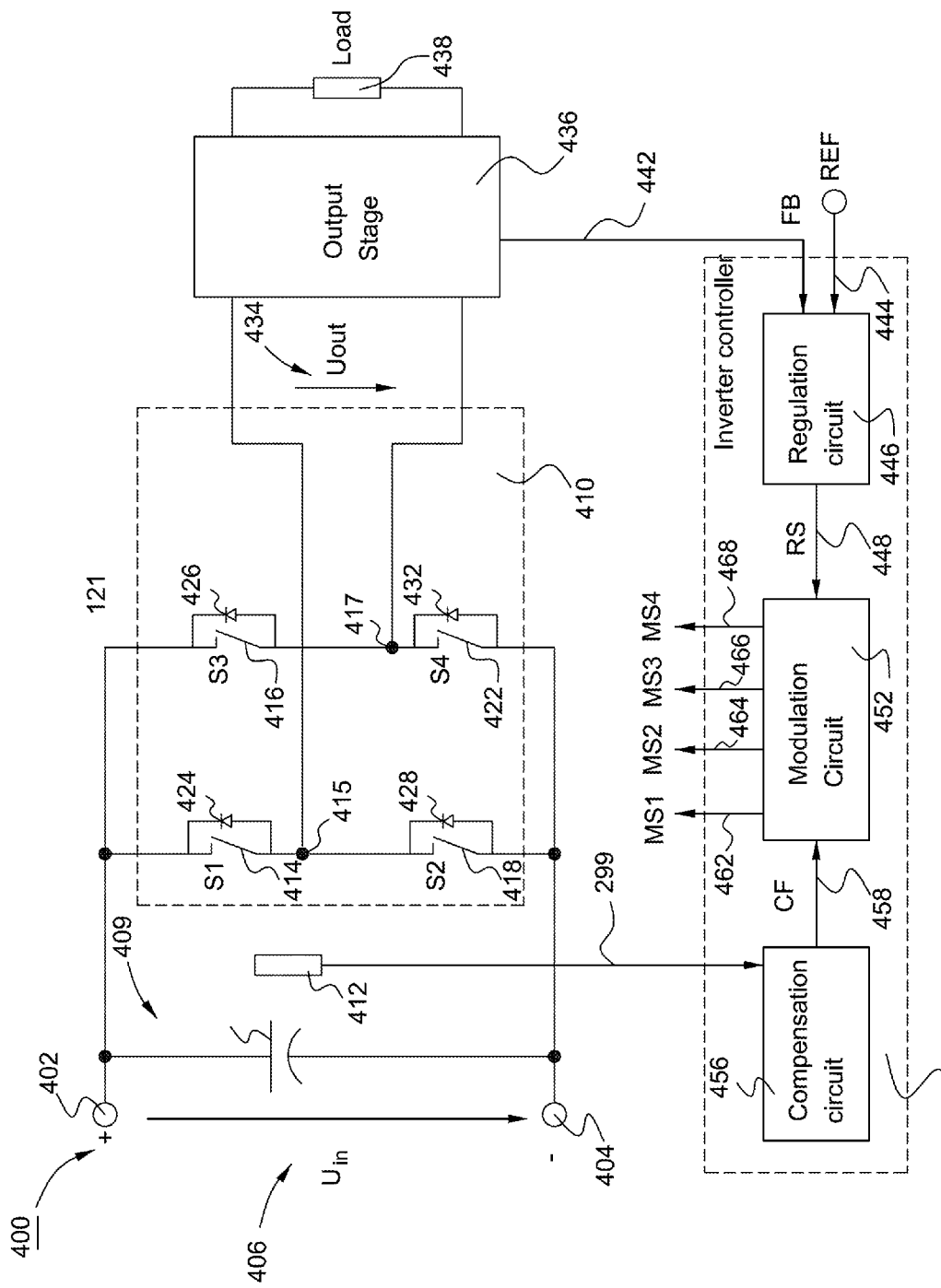
FIG. 9 is a schematic block diagram of a gradient amplifier shown in FIG. 1 in accordance with an exemplary embodiment of the present disclosure.

FIG. 9 is a schematic block diagram of a gradient amplifier 400 shown in FIG. 1 in accordance with one exemplary embodiment of the present disclosure. The gradient amplifier 400 is configured to accept power from a power supply and provide output signals for driving a load 438, such as a gradient coil for example. In an embodiment, the gradient amplifier 400 is a switching type amplifier. The switching type gradient amplifier 400 receives input DC voltage 406 at input terminals 402, 404. The input DC voltage 406 may be generated from the series resonant converter 100 using the various control algorithms described above with reference to FIGS. 2-8. The gradient amplifier 400 includes an input filter 408, which is shown as a smoothing capacitor for removing ripple signals contained in the input DC voltage 406. The gradient amplifier 400 further includes an inverter 410 and an inverter controller 420 electrically coupled to the inverter 410. The filtered DC voltage 409 is applied to the inverter 410 which is controlled under the control signals provided from the inverter controller 420 to generate output voltage 434 at two nodes 415, 417. The gradient amplifier 400 further includes an output stage 436 for supplying the output voltage 434 to the load 438.

Further referring to FIG. 9, the inverter 410 includes four switching devices 414, 416, 418, 422 and four free-wheeling diodes 424, 426, 428, 432. The switching devices 414, 416, 418, 422 may be any suitable switching devices, such as insulated gate bipolar transistors (IGBTs) and metal oxide semi-conductor field effect transistors (MOSFETs). The switching devices 414, 416, 418, 422 can be gated on or off according to switching signals provided from the inverter controller 420.

With continued reference to FIG. 9, the inverter controller 420 includes a compensation circuit 456, a regulation circuit 446, and a modulation circuit 452. The compensation circuit 456 is configured to receive an input DC voltage feedback signal 299 at a DC bus 407 obtained by means of a voltage sensor 412 placed across the capacitor 408. The compensation circuit 456 provides a compensation factor signal 458 indicating a voltage fluctuation of the input DC voltage 406. The compensation factor signal 458 is supplied to the modulation circuit 452 in generation of switching signals 462, 464, 466, 468. The regulation circuit 446 is configured to receive a reference voltage signal 444 indicating a desired voltage to be achieved at the output of the gradient amplifier 400. The regulation circuit 446 also receives a feedback output voltage signal 442 representing an actual output voltage produced by the gradient amplifier 400. The regulation circuit 446 further provides a regulator signal 448 according to the feedback output voltage signal 442 and the reference voltage signal 444. The regulator signal 448 is used for generating the switching signals 462, 464, 466, 468 for controlling operation of the switching devices 414, 416, 418, 422.

Figure 10:
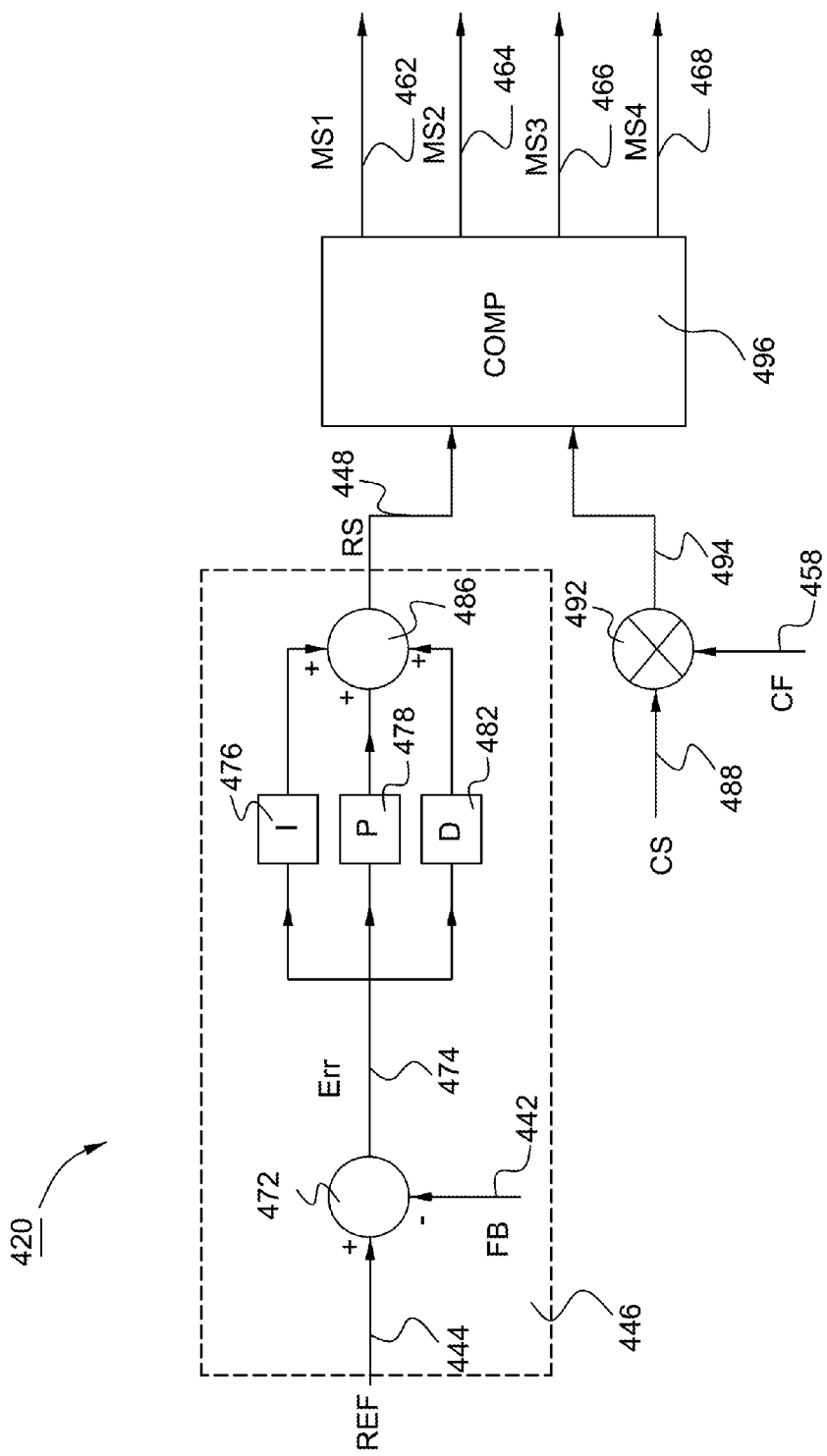
FIG. 10 is a detailed control diagram implemented by an inverter controller shown in FIG. 9 in accordance with an exemplary embodiment of the present disclosure.

FIG. 10 is a detailed control diagram implemented by an inverter controller 420 shown in FIG. 9 in accordance with an exemplary embodiment of the present disclosure. More specifically, the regulation circuit 446 includes a difference element 472, an integration element 476, a proportional element 478, a differentiation element 482, and a summation element 486. The difference element 472 is configured to receive the reference voltage signal 444 and the feedback output voltage signal 442 and generates a voltage error signal 474 representing a difference between the reference voltage signal 444 and the feedback output voltage signal 442. The voltage error signal 474 is supplied to the integration element 476, the proportional element 478, and the differentiation element 482. The resulting signals processed by the integration element 476, the proportional element 478, and the differentiation element 482 are combined in the summation element 486 to generate the regulation signal 448.

With continued reference to FIG. 10, the inverter controller 420 further includes a multiplication element 492 which is configured to multiply a carrier signal 488 by a compensation factor signal 458 and generate a compensated carrier signal 494. In one embodiment, the compensation factor signal 458 can be provided from the compensation circuit shown in FIG. 9 according to the following equation:

$$CF = \frac{U_{in}}{U_N},\qquad\text{Eqn. 7}$$

where in Eqn. 7, $U_{in}$ is the feedback DC voltage measured at the input of the inverter 410, $U_N$ is a nominal DC voltage desired to be supplied at the input of the inverter 410, and CF is the compensation factor signal 458.

With continued reference to FIG. 10, the inverter controller 420 further includes a comparator 496 which is configured to receive the regulation signal 448 provided from the regulation circuit 492 and the compensated carrier signal 494. The comparator 496 is further configured to generate the switching signals 462, 464, 466, 468 by comparing the regulation signal 448 and the compensated carrier signal 494.

In an implementation, the switching devices 414, 422 are turned on synchronously, and the switching devices 418, 416 are also turned on synchronously. Further, the switching devices 414, 418 are operated in a complementary manner, and the switching devices 416, 422 are operated in a complementary manner, thus, the following equations apply:

$$MS_1 + MS_2 = 1\qquad\text{Eqn. 8,}$$

$$MS_3 + MS_4 = 1\qquad\text{Eqn. 9,}$$

where in Eqn. 8 and Eqn. 9, $MS_1$ is the duty cycle of the switching signal 462, $MS_2$ is the duty cycle of the switching signal 464, $MS_3$ is the duty cycle of the switching signal 466, and $MS_4$ is the duty cycle of the switching signal 468. In one implementation, the carrier signal 494 is voltage signal having a triangular waveform and is defined with a positive maximum magnitude $CS_0$ and a negative maximum magnitude $-CS_0$. In one implementation, the duty cycles for example, the duty cycle $MS_1$ of the switching signal 462 can be generated according to the following equation:

$$MS_1 = 0.5 + 0.5 * \frac{RS}{CS_0},\qquad\text{Eqn. 10}$$

where RS is the regulation signal 448 generated by the regulation circuit 446, $CS_0$ is the positive maximum magnitude of the carrier signal 494. The relationship between the duty cycle $MS_1$ and the output voltage 434 can be expressed by the following equation:

$$U_{out} = \frac{U_{in}}{0.5} * MS_1 - U_{in},\qquad\text{Eqn. 11}$$

where $U_{out}$ is the output voltage 434, $U_{in}$ is the input DC voltage 406. Combining the equations 10 and 11, it can yield:

$$U_{out} = U_{in} * \frac{RS}{CS_0},\qquad\text{Eqn. 12}$$

From equation 12, it can be known that the output voltage 434 is not only linearly dependent on the regulation signal RS, but also dependent on the input DC voltage 406. For compensating the fluctuations in the input DC voltage 406, the output voltage 434 can be modified as the following equation:

$$U_{out} = U_{in} * \frac{RS}{CS_0 * CF} = U_N * \frac{RS}{CS_0},\qquad\text{Eqn. 13}$$

From equation 13, it can be seen that the modified output voltage 434 is only dependent on the regulation signal 448 after compensation. Thus, the fluctuations in the input DC voltage are substantially eliminated.

Figure 11:
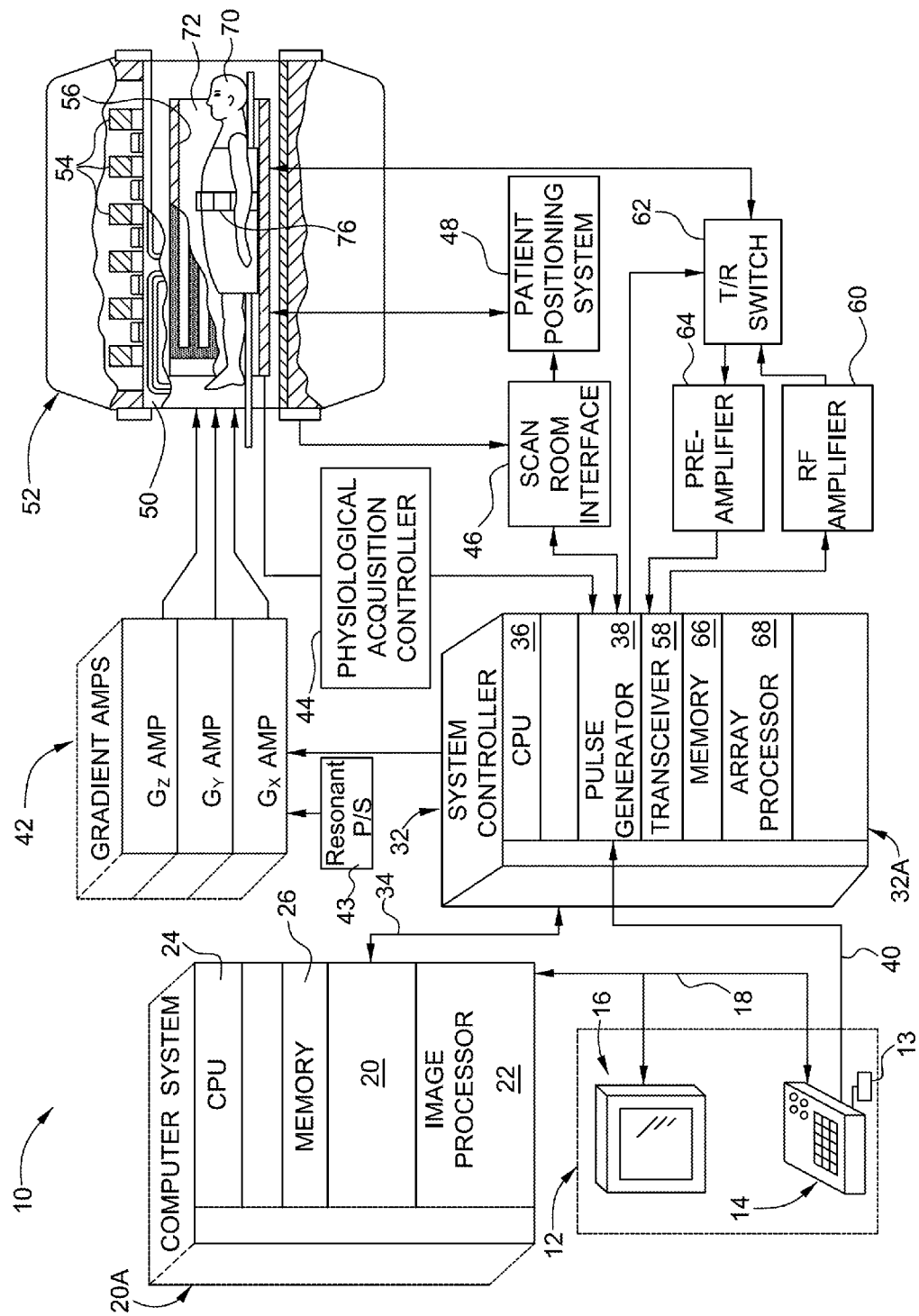
FIG. 11 is a schematic block diagram of an exemplary magnetic resonance system in accordance with an exemplary embodiment of the present disclosure.

FIG. 11 is a schematic block diagram of an exemplary magnetic resonance (MR) system 10 in accordance with one embodiment of the present disclosure. The MR system 10 is capable of incorporating the various embodiments described above for supplying power to gradient amplifiers of the MR system 10. The operation of MR system 10 is controlled from an operator console 12 that includes an input device 13, a control panel 14, and a display 16. The operator console 12 communicates through a link 18 with a computer system 20 and provides an interface for an operator to prescribe MR scans, display resultant images, perform image processing on the images, and archive data and images. The input device 13 may include a mouse, joystick, keyboard, track ball, touch activated screen, light wand, voice control, or any similar or equivalent input device, and may be used for interactive geometry prescription.

The computer system 20 includes a number of modules that communicate with each other through electrical and/or data connections, for example, such as are provided by using a backplane 20A. Data connections may be wired links or wireless communication links or the like. The modules of the computer system 20 may include an image processor module 22, a CPU module 24, and a memory module 26. The memory module 26 may include a frame buffer for storing image data arrays. The memory module 26 includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the image data arrays. In an alternative embodiment, the image processor module 22 may be replaced by image processing functionality on the CPU module 24. The computer system 20 may be linked to archival media devices, permanent or back-up memory storage or a network. The computer system 20 may also communicate with a separate system control computer 32 through a link 34.

The system control computer 32 in one aspect includes a set of modules in communication with each other via electrical and/or data connections 32A. Data connections 32a may be wired links or wireless communication links or the like. In alternative embodiments, the modules of computer system 20 and system control computer 32 may be implemented on the same computer system or a plurality of computer systems. The modules of system control computer 32 may include a CPU module 36 and a pulse generator module 38 that connects to the operator console 12 through a communications link 40.

The pulse generator module 38 in one example is integrated into the scanner equipment (e.g., resonance assembly 52). It is through link 40 that the system control computer 32 receives commands from the operator to indicate the scan sequence that is to be performed. The pulse generator module 38 operates the system components that perform the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms that control the timing and shape of the gradient pulses that are used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to the gradient amplifier system 42 that is comprised of Gx, Gy, and Gz amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a resonance assembly 52 that includes a polarizing superconducting magnet with superconducting main coils 54. In one implementation, the MR system 10 includes a power supply 43 for supplying power to the gradient amplifier system 42. The power supply 43 may be constructed from embodiments described above with reference to FIGS. 1-10.

Resonance assembly 52 may include a whole-body RF coil 56, surface or parallel imaging coils 76 or both. The coils 56, 76 of the RF coil assembly may be configured for both transmitting and receiving or for transmit-only or receive-only. A patient or imaging subject 70 may be positioned within a cylindrical patient imaging volume 72 of the resonance assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel coils or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 can also enable a separate RF coil (for example, a parallel or surface coil 76) to be used in either the transmit mode or receive mode.

The MR signals sensed by the RF coil 56 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long-term storage or it may be further processed by the image processor 22 and conveyed to the operator console 12 and presented on the display 16. The system control computer 32 further includes a hyperthermia source for generating hyperthermia RF signals.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A gradient amplifier for driving a gradient coil, the gradient amplifier comprising:
 a direct current (DC) bus for receiving DC voltage provided from a series resonant converter;

an inverter coupled to the DC bus configured to receive the DC voltage at the DC bus and convert the DC voltage to generate an output voltage to be applied to the gradient coil; and an inverter controller coupled to the inverter and configured to generate control signals to control operation of the inverter based at least on a DC voltage feedback signal measured at the DC bus, an output voltage feedback signal measured at the output of the inverter, and a reference output voltage signal indicative of a desired voltage to be achieved at the output of the inverter, the inverter controller comprising a compensation unit configured to receive the DC voltage feedback signal measured at the DC bus, wherein the compensation unit is further configured to provide a compensation signal according to the following equation:

$$CF = \frac{U_{in}}{U_N},$$

where $U_{in}$ is the DC voltage feedback signal measured at the DC bus, $U_N$ is a nominal DC voltage signal indicative of a desired DC voltage to be supplied at the DC bus, and CF is the compensation signal.

2. The gradient amplifier of claim 1, wherein the inverter controller further comprises a multiplication element configured to multiply a carrier signal with the compensation signal and generate a compensated carrier signal.

3. The gradient amplifier of claim 2, wherein the inverter controller further comprises a regulation unit configured to receive the output voltage feedback signal and the reference output voltage signal, and generate a regulator signal according to the received output voltage feedback signal and the reference output voltage signal.

4. The gradient amplifier of claim 3, wherein the regulation unit comprises:
a first summation element for receiving the output voltage feedback signal and the reference output voltage signal and providing an output voltage error signal representing a difference between the reference output voltage signal and the output voltage feedback signal;
an integration element for receiving the output voltage error signal provided from the first summation element and generating a first regulator signal according to the output voltage error signal;
a proportional element for receiving the output voltage error signal provided from the first summation element and generating a second regulator signal according to the output voltage error signal;
a differentiation element for receiving the output voltage error signal provided from the first summation element and generating a third regulator signal according to the output voltage error signal; and
a second summation element for generating a combined regulator signal by combining the first regulator signal, the second regulator signal and the third regulator signal.

5. The gradient amplifier of claim 3, wherein the inverter controller further comprises a comparator configured to receive the compensated carrier signal and the regulator signal and generate the control signals to be applied to the inverter by comparing the compensated carrier signal with the regulator signal.

6. A gradient amplifier for driving a gradient coil, the gradient amplifier comprising:

a direct current (DC) bus for receiving DC voltage provided from a series resonant converter;
an inverter coupled to the DC bus configured to receive the DC voltage at the DC bus and convert the DC voltage to generate an output voltage to be applied to the gradient coil;
an inverter controller coupled to the inverter, wherein the inverter controller is configured to generate control signals to control operation of the inverter based at least on a DC voltage feedback signal measured at the DC bus, an output voltage feedback signal measured at the output of the inverter, and a reference output voltage signal indicative of a desired voltage to be achieved at the output of the inverter; and
at least one of (i) an input filter coupled across the DC bus of the gradient amplifier, wherein the input filter is configured to remove ripple signals with the DC voltage at the DC bus, and (ii) a voltage sensor placed in electrical communication with the DC bus, wherein the voltage sensor is configured to provide the DC voltage feedback signal representing the DC voltage at the DC bus.

7. A method of operating a gradient amplifier to drive a gradient coil, the method comprising:
receiving a DC voltage feedback signal representing an input DC voltage at a DC bus of the gradient amplifier;
generating a compensation signal according to the DC voltage feedback signal and a nominal DC voltage signal indicative of a desired DC voltage to be achieved at the DC bus of the gradient amplifier;
receiving an output voltage feedback signal and a reference output voltage signal;
generating a regulator signal according to the output voltage feedback signal and the reference output voltage signal; and
generating control signals to be applied to an inverter of the gradient amplifier based at least on the compensation signal and the regulator signal, wherein generating a compensation signal comprises generating the compensation signal according to the following equation:

$$CF = \frac{U_{in}}{U_N},$$

where $U_{in}$ is the DC voltage feedback signal measured at the DC bus, $U_N$ is a nominal DC voltage desired to be supplied at the DC bus, and CF is the compensation signal.

8. The method of claim 7, further comprising multiplying the compensation signal with a carrier signal to obtain a compensated carrier signal.

9. The method of claim 8, further comprising:
comparing the compensated carrier signal with the regulator signal; and
generating the control signals according to a comparison result of the compensated carrier signal and the regulator signal.

10. A magnetic resonance system, comprising:
a main magnet for generating a main magnetic field;
a gradient coil for applying gradient magnetic field to the main magnetic field along selected gradient axes; and
a gradient amplifier coupled to the gradient coil for driving the gradient coil, the gradient amplifier comprising:
a direct current (DC) bus for receiving a DC voltage;
an inverter coupled to the DC bus configured to receive the DC voltage from the DC bus and convert the DC voltage to generate an output voltage to be applied to the gradient coil; and an inverter controller coupled to the inverter, wherein the inverter controller is configured to generate control signals to control operation of the inverter based at least on a DC voltage feedback signal measured at the DC bus, an output voltage feedback signal measured at the output of the inverter, and a reference output voltage signal indicative of a desired voltage to be achieved at the output of the inverter, wherein the inverter controller comprises a compensation unit configured to receive the DC voltage feedback signal measured at the DC bus, wherein the compensation unit is further configured to provide a compensation signal according to the following equation:

$$CF = \frac{U_{in}}{U_N},$$

where $U_{in}$ is the feedback DC voltage measured at the DC bus, $U_N$ is a nominal DC voltage signal indicative of a desired DC voltage to be supplied at the DC bus, and CF is the compensation signal.

11. The magnetic resonance system of claim 10, wherein the inverter controller further comprises a multiplication element configured to multiply a carrier signal with the compensation signal and generate a compensated carrier signal.

12. The magnetic resonance system of claim 11, wherein the inverter controller further comprises a regulation unit configured to receive the output voltage feedback signal and the reference output voltage signal, and generate a regulator signal according to the received output voltage feedback signal and the reference output voltage signal.

13. The magnetic resonance system of claim 11, wherein the regulation unit comprises:
   a first summation element for receiving the output voltage feedback signal and the reference output voltage signal and providing an output voltage error signal representing a difference between the reference output voltage signal and the output voltage feedback signal;
   an integration element for receiving the output voltage error signal provided from the first summation element and generating a first regulator signal according to the output voltage error signal;
   a proportional element for receiving the output voltage error signal provided from the first summation element and generating a second regulator signal according to the output voltage error signal;
   a differentiation element for receiving the output voltage error signal provided from the first summation element and generating a third regulator signal according to the output voltage error signal; and
   a second summation element for generating a combined regulator signal by combining the first regulator signal, the second regulator signal and the third regulator signal.

14. The magnetic resonance system of claim 11, wherein the inverter controller further comprises a comparator configured to receive the compensated carrier signal and the regulator signal and generate control signals to be applied to the inverter by comparing the compensated carrier signal with the regulator signal.

15. A magnetic resonance system, comprising:
   a main magnet for generating a main magnetic field;
   a gradient coil for applying gradient magnetic field to the main magnetic field along selected gradient axes; and
   a gradient amplifier coupled to the gradient coil for driving the gradient coil, the gradient amplifier comprising:
      a direct current (DC) bus for receiving a DC voltage;
      an inverter coupled to the DC bus configured to receive the DC voltage from the DC bus and convert the DC voltage to generate an output voltage to be applied to the gradient coil;
      an inverter controller coupled to the inverter, wherein the inverter controller is configured to generate control signals to control operation of the inverter based at least on a DC voltage feedback signal measured at the DC bus, an output voltage feedback signal measured at the output of the inverter, and a reference output voltage signal indicative of a desired voltage to be achieved at the output of the inverter; and
      at least one of (i) an input filter coupled across the DC bus of the gradient amplifier, wherein the input filter is configured to remove ripple signals with the DC voltage at the DC bus, and (ii) a voltage sensor placed in electrical communication with the DC bus, wherein the voltage sensor is configured to provide the DC voltage feedback signal representing the DC voltage at the DC bus.

* * * * *